(12) United States Patent
Nakajima

(10) Patent No.: US 6,967,410 B2
(45) Date of Patent: Nov. 22, 2005

(54) ELECTRONIC DEVICE, METHOD OF MANUFACTURING THE SAME, AND ELECTRONIC INSTRUMENT

(75) Inventor: Akira Nakajima, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/722,609

(22) Filed: Nov. 28, 2003

(65) Prior Publication Data

US 2004/0150115 A1    Aug. 5, 2004

(30) Foreign Application Priority Data

Dec. 5, 2002    (JP) ............... 2002-353338

(51) Int. Cl.[7] ............................................. H01L 23/48
(52) U.S. Cl. ...................... 257/777; 257/88; 257/783
(58) Field of Search ................ 257/88, 443, 444, 257/686, 777, 782, 783

(56) References Cited

U.S. PATENT DOCUMENTS

| | | | | |
|---|---|---|---|---|
| 6,127,203 A | * | 10/2000 | Wan et al. | 438/67 |
| 6,159,767 A | * | 12/2000 | Eichelberger | 438/107 |
| 6,610,455 B1 | * | 8/2003 | Burberry et al. | 430/200 |
| 6,762,078 B2 | * | 7/2004 | Shin et al. | 438/123 |
| 6,818,836 B2 | * | 11/2004 | Shiraishi et al. | 174/260 |
| 2003/0094685 A1 | * | 5/2003 | Shiraishi et al. | 257/686 |

FOREIGN PATENT DOCUMENTS

JP    A 2001-332383    11/2001

OTHER PUBLICATIONS

U.S. Appl. No. 10/445,079, filed May 27, 2003, Imamura.

* cited by examiner

Primary Examiner—T. N. Quach
(74) Attorney, Agent, or Firm—Oliff & Berridge, PLC

(57) ABSTRACT

An electronic device includes: a circuit board, at least part of the circuit board being formed of two or more types of semiconductor chips having different functions, arranged so as not to overlap, and fixed to each other; and a plurality of operating elements formed over the circuit board.

15 Claims, 10 Drawing Sheets

ELECTRONIC DEVICE, METHOD OF MANUFACTURING THE SAME, AND ELECTRONIC INSTRUMENT

Japanese Patent Application No. 2002-353338, filed on Dec. 5, 2002, is hereby incorporated by reference in its entirety.

BACKGROUND OF THE INVENTION

The present invention relates to an electronic device, a method of manufacturing the same, and an electronic instrument.

In the case of applying an active matrix drive method to an electronic device such as an electroluminescent panel or a liquid crystal panel, an operating element (light-emitting element or liquid crystal element) and a circuit (switch, etc.) for driving the operating element are provided in each pixel. It is known in the art that the switch is formed by using a thin film transistor. However, it is difficult to obtain characteristics equal to the characteristics of a transistor formed in an integrated circuit chip by using a thin film transistor. Therefore, it is difficult to obtain a circuit board having excellent characteristics.

BRIEF SUMMARY OF THE INVENTION

According to one aspect of the present invention, there is provided an electronic device comprising:

a circuit board, at least part of which is formed of two or more types of semiconductor chips having different functions, arranged so as not to overlap, and fixed to each other; and a plurality of operating elements provided over the circuit board.

According to another aspect of the present invention, there is provided an electronic instrument comprising the above electronic device.

According to a further aspect of the present invention, there is provided a method of manufacturing an electronic device comprising:

forming at least part of a circuit board by arranging two or more types of semiconductor chips having different functions so as not to overlap, and fixing the semiconductor chips to each other by using a resin; and forming a plurality of operating elements over the circuit board.

DETAILED DESCRIPTION OF THE EMBODIMENT

Figure 1:
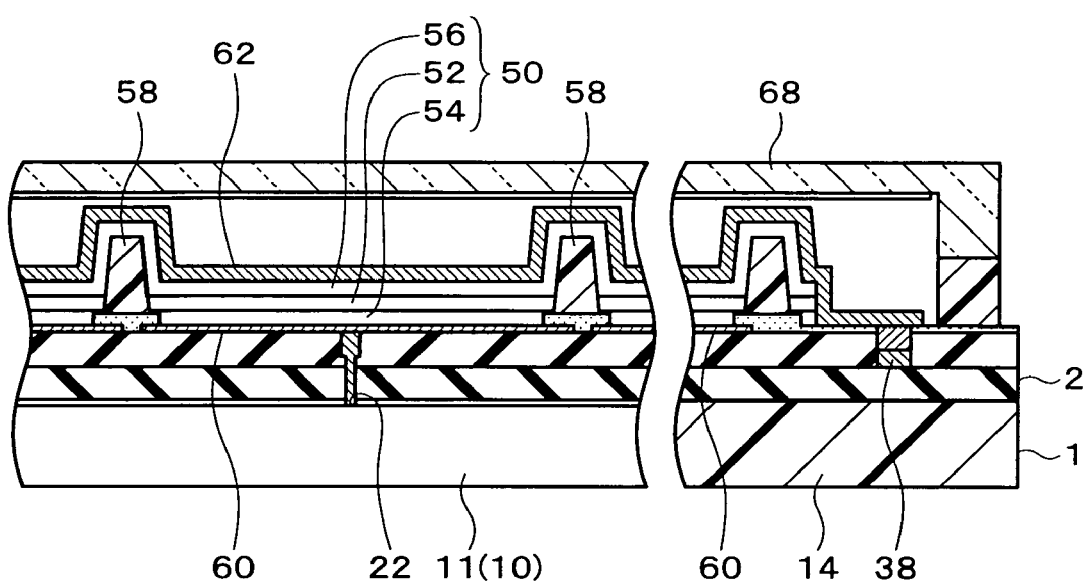
FIG. 1 is a view for illustrating an electronic device according to one embodiment of the present invention.

An objective of the embodiments of the present invention is to provide an electronic device including a circuit board having excellent characteristics, a method of manufacturing such an electronic device, and an electronic instrument.

(1) According to one embodiment of the present invention, there is provided an electronic device comprising:

a circuit board, at least part of which is formed of two or more types of semiconductor chips having different functions, arranged so as not to overlap, and fixed to each other; and a plurality of operating elements provided over the circuit board.

According to this electronic device, since at least part of the circuit board is formed by the semiconductor chips and the semiconductor chips having different functions are embedded, an electronic device including a circuit board having excellent characteristics can be obtained.

(2) In this electronic device, the two or more types of semiconductor chips may include a group of first semiconductor chips and a group of second semiconductor chips; each of the first semiconductor chips may have a first circuit which drives the operating elements; and each of the second semiconductor chips may include a second circuit which controls the first circuits.

(3) In this electronic device, the first semiconductor chips may be arranged in a plurality of rows and columns; and one of the second semiconductor chips may be disposed in each of the columns.

(4) In this electronic device, each of the first circuits of the first semiconductor chips may be controlled by the second circuit of the second semiconductor chip arranged in the same column.

(5) In this electronic device, at least one of the first semiconductor chips may have a buffer which amplifies an input signal and outputs the amplified signal.

(6) The electronic device may further comprise an interconnecting layer provided between the circuit board and the operating elements.

(7) In this electronic device, the interconnecting layer may include a plurality of first interconnects which do not intersect each other and a plurality of second interconnects which do not intersect each other; and the first and second interconnects may be arranged to intersect each other into a lattice structure.

(8) In this electronic device, one of two voltages having the largest potential difference among voltages used in the first semiconductor chips may be applied to the first and second interconnects.

(9) In this electronic device, the operating elements may include a first operating element disposed outside of one of the first semiconductor chips, and a second operating element disposed to overlap one of the first semiconductor chips; and each of the first semiconductor chips may have a first contact section disposed on an edge portion of the first semiconductor chip to be electrically connected to the first operating element, and a second contact section disposed in a center portion of the first semiconductor chip except the edge portion and electrically connected to the second operating element.

(10) In this electronic device, the second operating element may be disposed to overlap the second contact section.

(11) In this electronic device, each of the operating elements may include one of light-emitting layers each of which emits one of a plurality of colors.

(12) According to another embodiment of the present invention, there is provided an electronic instrument comprising the above-described electronic device.

(13) According to a further embodiment of the present invention, there is provided a method of manufacturing an electronic device comprising:

forming at least part of a circuit board by arranging two or more types of semiconductor chips having different functions so as not to overlap, and fixing the semiconductor chips to each other by using a resin; and forming a plurality of operating elements over the circuit board.

According to this method of manufacturing an electronic device, since at least part of the circuit board is formed by the semiconductor chips and the semiconductor chips having different functions are embedded, an electronic device including a circuit board excellent in characteristics can be obtained.

An embodiment of the present invention is described below with reference to the drawings. FIG. 1 is a view for illustrating an electronic device according to this embodiment of the present invention. The electronic device may be an electro-optical device such as a display device (display panel, for example) or a storage device. The electronic device shown in FIG. 1 is an organic electroluminescent (EL) device (organic EL panel, for example). The electronic device includes a circuit board 1.

Figure 2A:
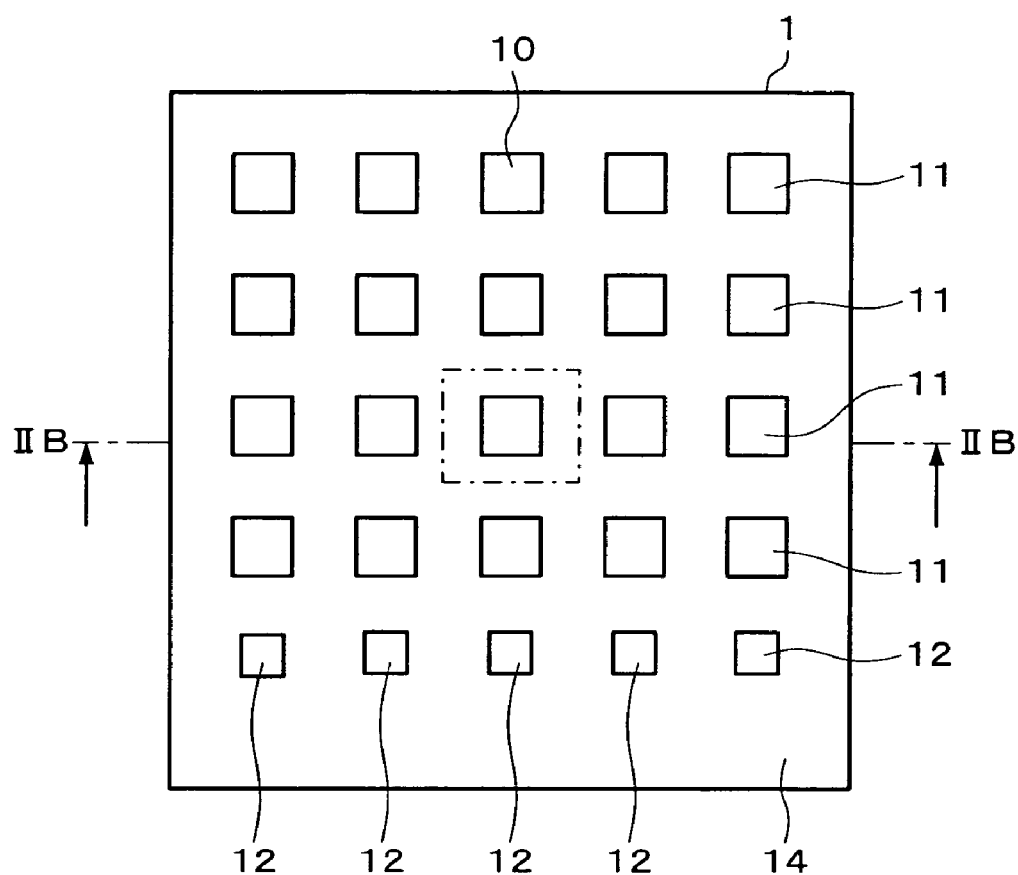
FIG. 2A is a view for illustrating a circuit board of the electronic device.
Figure 2B:
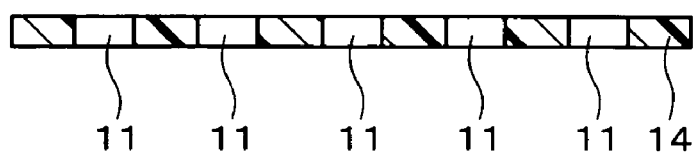
FIG. 2B is a cross-sectional view taken along the line IIB–IIB of FIG. 2A.

FIG. 2A is a view showing the circuit board, and FIG. 2B is a cross-sectional view taken along the line IIB–IIB of FIG. 2A. At least part of the circuit board 1 is formed of a plurality of semiconductor chips 10. The semiconductor chips 10 are arranged so as not to overlap. A passivation film may be formed on the surface of the semiconductor chip 10 (surface on which an integrated circuit is formed or surface on which electrodes are formed, for example). The semiconductor chips are fixed to each other. The semiconductor chips may be fixed to each other by using a resin (or adhesive). A fixing section 14 is formed at least between the adjacent semiconductor chips 10. The fixing section 14 may be formed to enclose all the semiconductor chips 10. The surface of the fixing section 14 may be level with the surface of the semiconductor chip 10, or a difference in level may be formed. The fixing section 14 may be formed of an insulator.

The semiconductor chips 10 may be arranged in a plurality of rows and columns (or in a matrix). A passivation film may be formed on the surface of the semiconductor chip 10 on which sections electrically connected with the outside (first to fourth contact sections 21 to 24, for example) are formed. All the sections electrically connected with the outside may be formed on a single surface.

The semiconductor chips 10 are divided into two or more types of semiconductor chips, and have different functions corresponding to the type. The plurality of types of semiconductor chips 10 may include a group of first semiconductor chips 11 and a group of second semiconductor chips 12. The first semiconductor chips 11 may be arranged in a plurality of rows and columns. One of the second semiconductor chips 12 may be arranged in each column of the first semiconductor chips 11.

Figure 9:
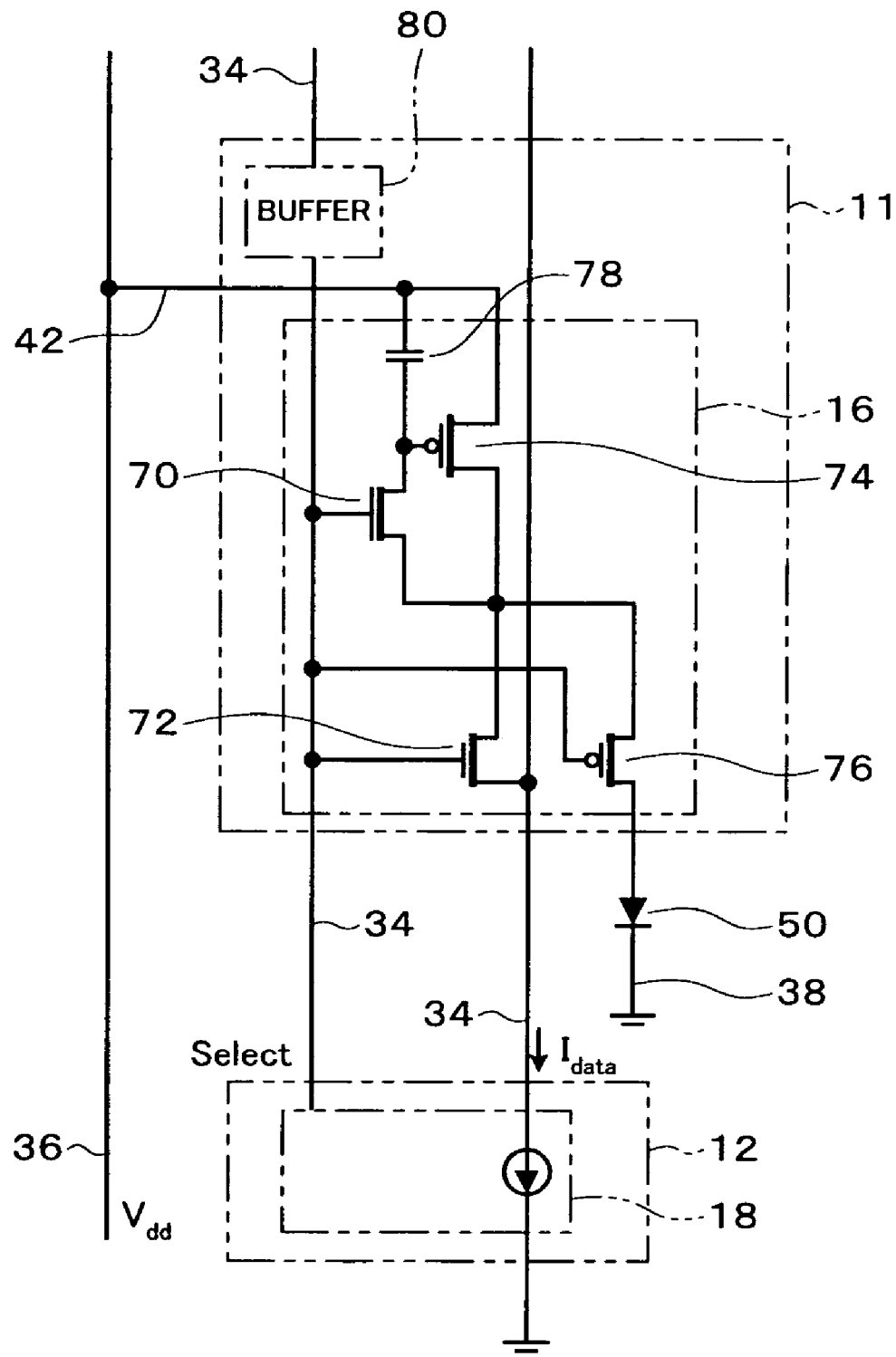
FIG. 9 is another circuit diagram for illustrating an operation of the electronic device.

The first semiconductor chip 11 may include a first circuit 16 which drives each of a plurality of operating elements (see FIG. 9). The second semiconductor chip 12 may include a second circuit 18 for controlling the first circuit 16 (see FIG. 9). Each of the first circuits 16 of the first semiconductor chips 11 in one column may be controlled by the second circuit 18 of the second semiconductor chip 12 arranged in the same column.

Figure 3:
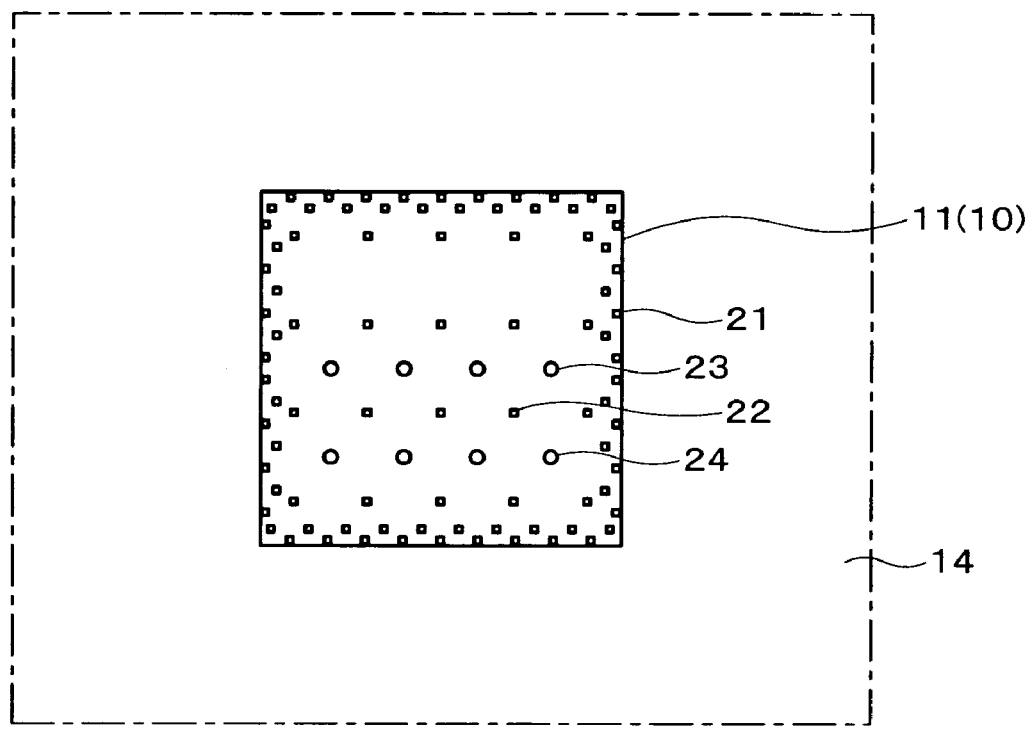
FIG. 3 is a view showing a first semiconductor chip and its peripheral section.

FIG. 3 is an enlarged view of a section of the circuit board shown in FIG. 2A enclosed by a dot-dash line. FIG. 3 shows the first semiconductor chip 11. The first semiconductor chip 11 may include first contact sections 21 which are arranged on the edges of the first semiconductor chip 11 and electrically connected with first operating elements 64 (see FIG. 7). The first semiconductor chip 11 may include second contact sections 22 which are arranged at the center of the first semiconductor chip 11 (section excluding the edges) and electrically connected with second operating elements 66 (see FIG. 7). At least one of the first and second contact sections 21 and 22 may be contact holes.

The first semiconductor chip 11 may include at least one of third and fourth contact sections 23 and 24. One of two voltages having the largest potential difference among voltages used in the first semiconductor chip 11 (power supply voltage and ground voltage, for example) may be applied to each of the third and fourth contact sections 23 and 24. At least one of the third and fourth contact sections 23 and 24 may be formed to be larger (in diameter or width, for example) than the first and second contact sections 21 and 22. The second semiconductor chip 12 may also include the third and fourth contact sections 23 and 24.

As shown in FIG. 1, the electronic device includes an interconnecting layer 2 formed of at least one layer (a plurality of layers in this embodiment). The interconnecting layer 2 is formed on the circuit board 1. The interconnecting layer 2 is formed between the circuit board 1 and the operating elements 50.

Figure 4:
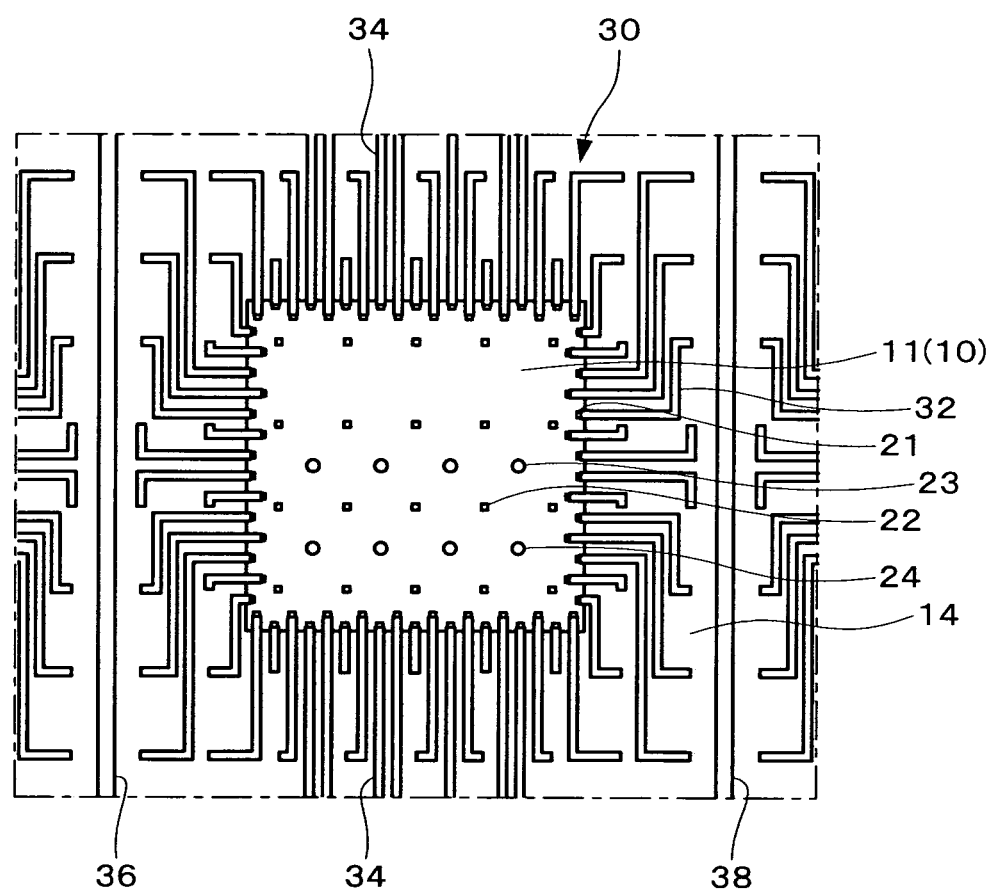
FIG. 4 is a view for illustrating an interconnecting layer.
Figure 5:
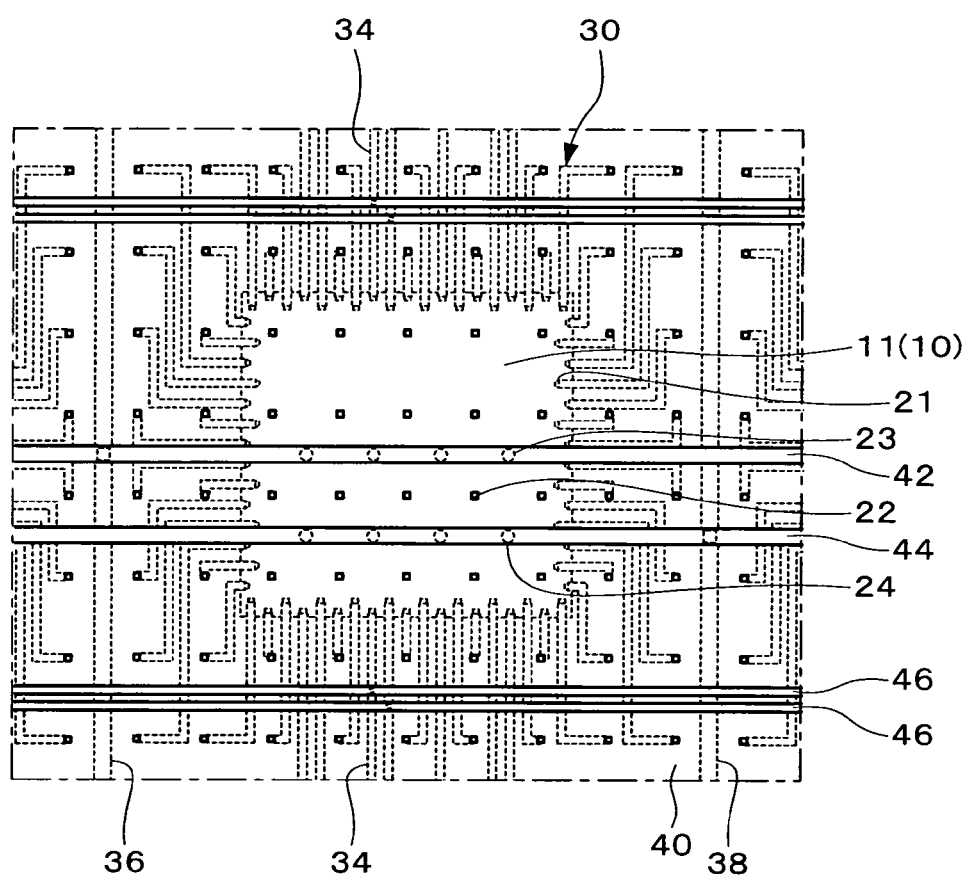
FIG. 5 is another view for illustrating an interconnecting layer.

FIGS. 4 and 5 are views for illustrating the structure of the interconnecting layer from the bottom side. FIG. 4 is a view showing the lowermost layer of the interconnecting layer. The lowermost layer of the interconnecting layer 2 includes an interconnecting pattern 30. The interconnecting pattern 30 is formed on the semiconductor chips 10 (first and second semiconductor chips 11 and 12) and the fixing section 14. The interconnecting pattern 30 includes a plurality of interconnects 32. Each of the interconnects 32 is electrically connected with one of the first contact sections 21, and extends to a location under one of the first operating elements 64 (see FIG. 7). The interconnecting pattern 30 includes a plurality of interconnects 34. The interconnect 34 may electrically connect the adjacent first semiconductor chips 11 or the first and second semiconductor chips 11 and 12 in one of the columns of the semiconductor chips 10 arranged in the shape of a matrix. The interconnecting pattern 30 includes a plurality of first interconnects 36 and 38 which do not intersect (extend in parallel, for example). The first interconnects 36 and 38 may be formed to avoid the semiconductor chips 10 (first and second semiconductor chips 11 and 12, for example). The first interconnects 36 and 38 may be formed on the fixing section 14. The first interconnects 36 and 38 are disposed alternately (see FIG. 6). The first interconnects 36 and 38 may be electrically connected with the first and second semiconductor chips 11 and 12 through interconnects in another layer. The first interconnects 36 and 38 may be formed to have a width greater than the widths of the interconnects 32 and 34.

As shown in FIG. 5, an insulating layer 40 is formed on the interconnecting pattern 30. A plurality of second interconnects 42 and 44 are formed on the insulating layer 40. The second interconnects 42 and 44 are formed so as not to intersect (extend in parallel, for example). The second interconnects 42 and 44 are disposed alternately (see FIG. 6). The second interconnect 42 and 44 may be formed to have a width greater than the widths of other interconnects. The second interconnects 42 and 44 may be formed to pass over the semiconductor chips 10 (first and second semiconductor chips 11 and 12, for example). The first and second interconnects 36, 38, 42, and 44 may be arranged to intersect each other into a lattice structure (see FIG. 6).

Figure 6:
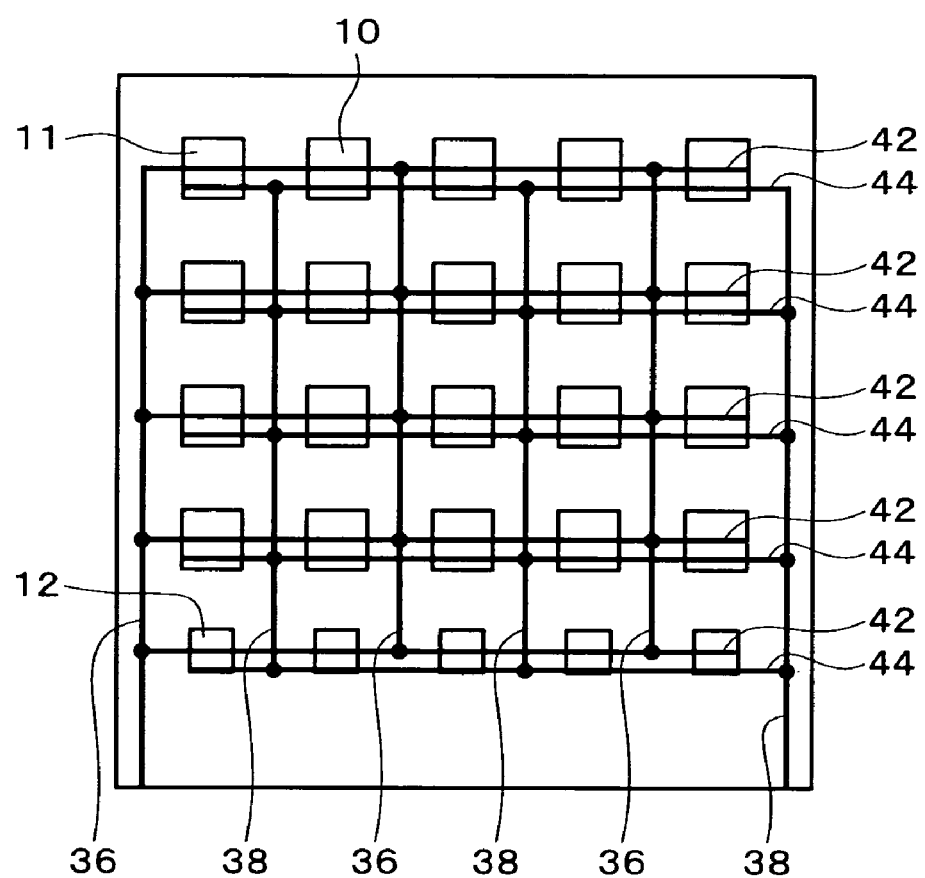
FIG. 6 is a view for illustrating a connection of an interconnecting layer.

FIG. 6 is a view for illustrating the connection of the first and second interconnects 36, 38, 42, and 44. One of two voltages having the largest potential difference among voltages used in the semiconductor chip 10 (power supply voltage and ground voltage, for example) is applied to one of the first interconnects 36 and one of the first interconnects 38. The first interconnects 36 are electrically connected through the second interconnects 42. Therefore, the first interconnects 36 are at the same potential. The first interconnects 38 are electrically connected through the second interconnects 44. The first interconnects 38 are at the same potential. As shown in FIG. 5, the second interconnects 42 and 44 are electrically connected with the third and fourth contact sections 23 and 24, respectively. The second interconnects 42 and 44 are electrically connected with the first interconnects 36 and 38, respectively.

According to this embodiment, since the circuit board has the above-described interconnect structure, a plurality of voltage input paths to the semiconductor chip 10 are formed. This enables the impedance to be reduced, whereby a uniform voltage can be applied to all the semiconductor chips 10.

As shown in FIG. 5, interconnects 46 are formed on the insulating layer 40. An interconnect 46 may be electrically connected with one of the interconnects 34. The interconnects 46 and 34 may be formed to intersect. An interconnect 46 may electrically connect the adjacent first semiconductor chips 11 in one of the rows of the semiconductor chips 11 arranged in the shape of a matrix.

As shown in FIG. 1, the electronic device includes a plurality of operating elements 50. The operating elements 50 are formed over the circuit board 1. The operating elements 50 include a plurality of light-emitting layers 52 of a plurality of emitted colors (red, green, and blue, for example). Each of the operating elements 50 includes the light-emitting layer 52 of one of the emitted colors. A material for the light-emitting layer 52 may be a polymer material, a low-molecular-weight material, or a material in which these materials are used in combination. The light-emitting layer 52 emits light by having current flow through it. The luminous efficiency of the light-emitting layers 52 may differ corresponding to the emitted colors.

The operating element 50 may include at least one of first and second buffer layers 54 and 56. The first buffer layer 54 may be a hole injection layer which stabilizes injection of holes into the light-emitting layer 52, or may include a hole injection layer. The first buffer layer 54 may include a hole transport layer. The hole transport layer may be formed between the light-emitting layer 52 and the hole injection layer. The second buffer layer 56 may be an electron injection layer which stabilizes injection of electrons into the light-emitting layer 52, or may include an electron injection layer. The second buffer layer 56 may include an electron transport layer. The electron transport layer may be formed between the light-emitting layer 52 and the electron injection layer. The adjacent operating elements 50 are partitioned (electrically insulated) by a bank 58.

The electronic device includes a plurality of first electrodes 60. Each of the first electrodes 60 supplies electrical energy to one of the operating elements 50. The first electrode 60 may be in contact with the operating element 50 (first buffer layer 54 (hole injection layer), for example). The first electrode 60 may be electrically connected with the first interconnect 34. The electronic device includes at least one second electrode 62. The second electrode 62 supplies electrical energy to the operating element 50. The second electrode 62 may be in contact with the operating element 50 (second buffer layer 56 (electron injection layer), for example). The second electrode 62 has a section which faces the first electrode 60. The second electrode 62 may be disposed over the first electrode 60.

Figure 7:
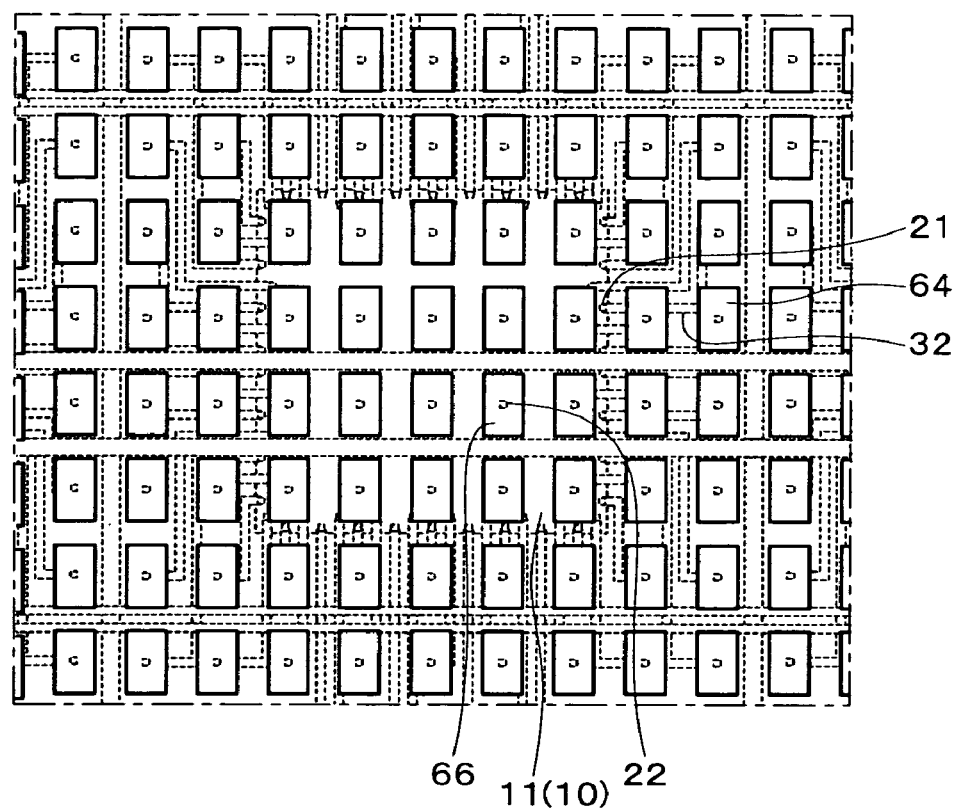
FIG. 7 is a view for illustrating the arrangement of operating elements.

FIG. 7 is a view for illustrating the arrangement of the operating elements. The operating elements 50 include first operating elements 64 disposed outside the first semiconductor chip 11, and second operating elements 66 disposed to overlap the first semiconductor chip 11. The first operating element 64 is electrically connected with the interconnect 32. The first operating element 64 is disposed to overlap the interconnect 32 pulled out from the first contact section 21. The second operating element 66 is electrically connected with one of the second contact sections 22. The second operating element 66 may be disposed to overlap one of the second contact sections 22. This enables the distance between the second contact section 22 and the second operating element 66 to be reduced, whereby a voltage drop can be reduced. In the case where at least part of the operating element 50 tends to deteriorate due to water, oxygen, or the like, the operating element 50 may be protected by a sealing member 84.

Figure 8:
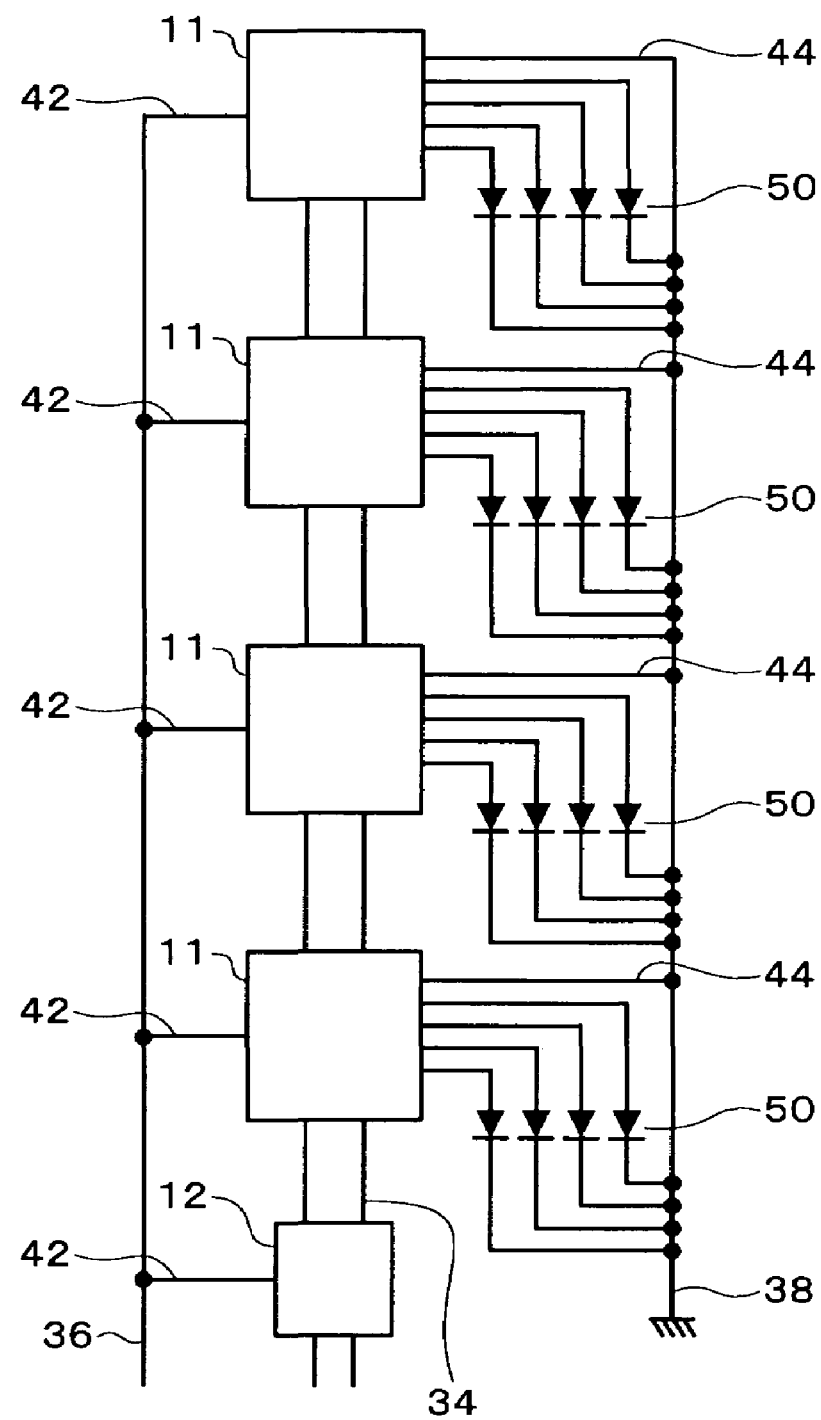
FIG. 8 is a circuit diagram for illustrating an operation of the electronic device.

FIGS. 8 and 9 are circuit diagrams for illustrating the operation of the electronic device according to this embodiment. As shown in FIG. 8, one second semiconductor chip 12 is further arranged in the column of a group of the first semiconductor chips 11. The first semiconductor chips 11 in one column are controlled by one second semiconductor chip 12 in the same column, and the operating elements 50 are driven by the first semiconductor chips 11. The first and second semiconductor chips 11 and 12 are provided with a power supply through the first interconnects 36 and 38.

FIG. 9 is a circuit diagram for illustrating the operation of the first and second semiconductor chips. The first semiconductor chip 11 includes the first circuit 16, and the second semiconductor chip 12 includes the second circuit 18. The configuration (element connection state) of the first and second circuits 16 and 18 is as shown in FIG. 9. Description of the configuration is omitted. In this embodiment, the first interconnect 38 is connected with a low potential (ground potential, for example), and the first interconnect 36 is connected with a potential higher than that of the first interconnect 38. A current $I_{data}$ flows through the interconnect (signal line) 34. The current $I_{data}$ is a signal corresponding to a current supplied to the operating element 50. A select signal is input to the interconnect (scanning line) 34. The select signal is either an H signal at a high potential or an L signal at a low potential.

In a programming period, a voltage $V_{dd}$ is supplied to the first interconnect 36, whereby the current $I_{data}$ flows through the interconnect (signal line) 34. In the programming period, the H signal is input to the interconnect (scanning line) 34, whereby switching elements 70 and 72 are turned ON and a switching element 76 is turned OFF. When the current $I_{data}$ flows through the interconnect (signal line) 34 from the first interconnect 36 through the switching elements 74 and 72, a control voltage of the switching element 74 (gate voltage in the case where the switching element 74 is a MOS transistor) becomes a value corresponding to the current $I_{data}$, and a charge corresponding to the control voltage is stored in a capacitor 78.

In an operation period (light-emitting period, for example), the L signal is input to the interconnect (scanning line) 34, whereby the switching elements 70 and 72 are turned OFF and the switching element 76 is turned ON. The switching element 74 is controlled (turned ON, for example) by the control voltage (gate voltage in the case where the switching element 74 is a MOS transistor) corresponding to the charge stored in the capacitor 78 in the programming period, whereby a current corresponding to the control voltage flows through the operating element 50 from the first interconnect 36 through the switching elements 74 and 76. The first circuit 16 is provided for each of the operating elements 50.

At least one of the first semiconductor chips 11 may include a buffer 80 which amplifies an input signal and outputs the amplified input signal. For example, the buffer 80 may be electrically connected with the interconnect 34 through which a signal (select signal or clock signal, for example) is transmitted, and the amplified input signal may be output to another first semiconductor chip 11 through another interconnect 34. This prevents deterioration of the signal such as delay or rounding.

In a method of manufacturing the electronic device according to this embodiment, two or more types of semiconductor chips 10 (first and second semiconductor chips 11 and 12, for example) having different functions are arranged so as not to overlap. The semiconductor chips 10 are fixed to each other by using a resin or the like to form at least part of the circuit board 1. A plurality of operating elements 50 are formed over the circuit board 1.

This embodiment illustrates the case where the present invention is applied to a display device. However, the present invention can be applied to other electronic devices. For example, a flat image sensor (flat copy device as an application example) may be realized by arranging light-emitting elements and light-receiving elements as the operating elements. Light of the three primary colors (R, G, B) may be alternately or simultaneously emitted from the light-emitting elements, and the light at each wavelength may be converted into electrical signals by the light-receiving elements corresponding to the intensity of light. An original image can be reproduced by processing the electrical signals. Micro-actuators may be arranged as the operating elements by utilizing the micro electro mechanical systems (MEMS) technology. This enables a tactile display, speaker, phased array antenna, and the like to be formed.

Figure 10:
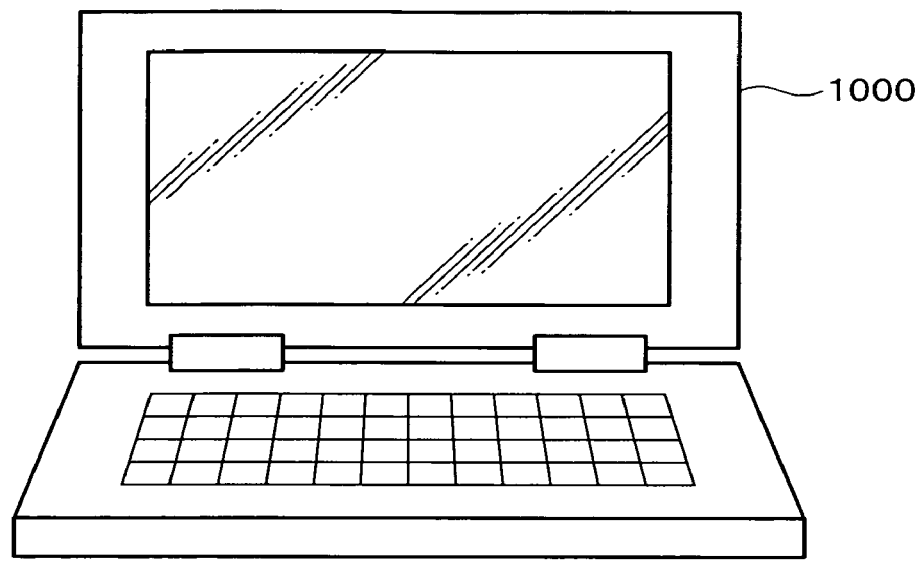
FIG. 10 is a view showing an electronic instrument according to one embodiment of the present invention.
Figure 11:
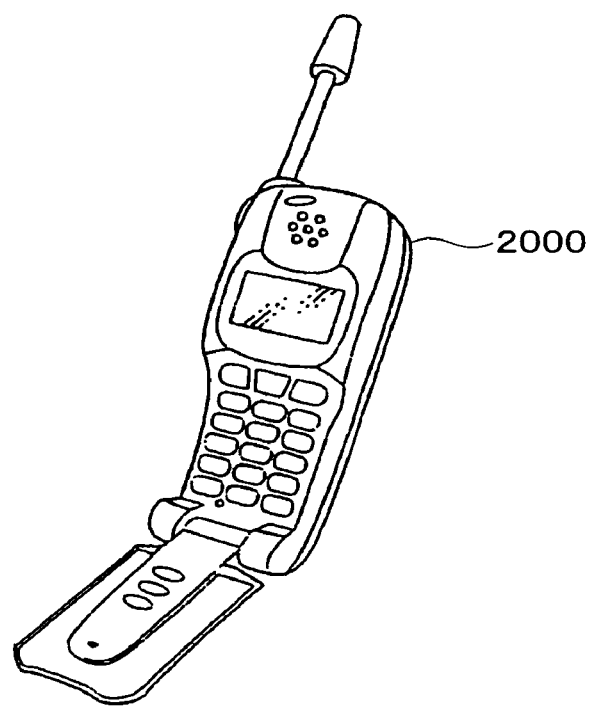
FIG. 11 is a view showing another electronic instrument according to one embodiment of the present invention.

FIGS. 10 and 11 respectively show a notebook-type personal computer 1000 and a portable telephone 2000 as examples of electronic instruments including the electronic device according to the embodiment of the present invention.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. An electronic device comprising:
    a circuit board, at least part of which is formed of two or more types of semiconductor chips having different functions, arranged so as not to overlap, and fixed to each other; and
    a plurality of operating elements provided over the circuit board, wherein:
    the two or more types of semiconductor chips include a group of first semiconductor chips and a group of second semiconductor chips;
    each of the first semiconductor chips has a first circuit which drives the operating elements; and
    each of the second semiconductor chips includes a second circuit which controls the first circuits.

2. The electronic device as defined in claim 1, wherein:
    the first semiconductor chips are arranged in a plurality of rows and columns; and
    one of the second semiconductor chips is disposed in each of the columns.

3. The electronic device as defined in claim 2,
    wherein each of the first circuits of the first semiconductor chips is controlled by the second circuit of the second semiconductor chip arranged in the same column.

4. The electronic device as defined in claim 3,
    wherein at least one of the first semiconductor chips has a buffer which amplifies an input signal and outputs the amplified signal.

5. The electronic device as defined in claim 2,
    wherein at least one of the first semiconductor chips has a buffer which amplifies an input signal and outputs the amplified signal.

6. The electronic device as defined in claim 2, wherein:
    the operating elements include a first operating element disposed outside of one of the first semiconductor chips, and a second operating element disposed to overlap one of the first semiconductor chips; and
    each of the first semiconductor chips has a first contact section disposed on an edge portion of the first semiconductor chip to be electrically connected to the first operating element, and a second contact section disposed in a center portion of the first semiconductor chip except the edge portion and electrically connected to the second operating element.

7. The electronic device as defined in claim 6,
    wherein the second operating element is disposed to overlap the second contact section.

8. The electronic device as defined in claim 1,
    wherein at least one of the first semiconductor chips has a buffer which amplifies an input signal and outputs the amplified signal.

9. The electronic device as defined in claim 1, further comprising an interconnecting layer provided between the circuit board and the operating elements.

10. The electronic device as defined in claim 9, wherein:
    the interconnecting layer includes a plurality of first interconnects which do not intersect each other and a plurality of second interconnects which do not intersect each other; and
    the first and second interconnects are arranged to intersect each other into a lattice structure.

11. The electronic device as defined in claim 10,
wherein one of two voltages having the largest potential difference among voltages used in the first semiconductor chips is applied to the first and second interconnects.

12. The electronic device as defined in claim 1, wherein:
the operating elements include a first operating element disposed outside of one of the first semiconductor chips, and a second operating element disposed to overlap one of the first semiconductor chips; and
each of the first semiconductor chips has a first contact section disposed on an edge portion of the first semiconductor chip to be electrically connected to the first operating element, and a second contact section disposed in a center portion of the first semiconductor chip except the edge portion and electrically connected to the second operating element.

13. The electronic device as defined in claim 12,
wherein the second operating element is disposed to overlap the second contact section.

14. The electronic device as defined in claim 1,
wherein each of the operating elements includes one of light-emitting layers each of which emits one of a plurality of colors.

15. An electronic instrument comprising the electronic device as defined in claim 1.

* * * * *